United States Patent
Bobde

(10) Patent No.: US 8,558,275 B2
(45) Date of Patent: Oct. 15, 2013

(54) SAWTOOTH ELECTRIC FIELD DRIFT REGION STRUCTURE FOR POWER SEMICONDUCTOR DEVICES

(75) Inventor: Madhur Bobde, San Jose, CA (US)

(73) Assignee: Alpha and Omega Semiconductor Ltd (BM)

( * ) Notice: Subject to any disclaimer, the term of this patent is extended or adjusted under 35 U.S.C. 154(b) by 433 days.

(21) Appl. No.: 12/006,399

(22) Filed: Dec. 31, 2007

(65) Prior Publication Data
US 2009/0166672 A1 Jul. 2, 2009

(51) Int. Cl.
*H01L 29/74* (2006.01)

(52) U.S. Cl.
USPC .................................. 257/139; 257/E29.012

(58) Field of Classification Search
USPC ................... 257/E29.027, E29.006, E29.197, 257/E31.382, 262, 197, 273, 361, 362, 329, 257/E21.382, 139, E29.005, E29.012
See application file for complete search history.

(56) References Cited

U.S. PATENT DOCUMENTS

| | | | | |
|---|---|---|---|---|
| 4,821,095 A * | 4/1989 | Temple | ......................... | 257/145 |
| 5,326,711 A * | 7/1994 | Malhi | ......................... | 438/138 |
| 5,473,176 A * | 12/1995 | Kakumoto | ..................... | 257/192 |
| 5,702,961 A * | 12/1997 | Park | ............................. | 438/138 |
| 6,037,632 A * | 3/2000 | Omura et al. | ................. | 257/341 |
| 6,147,382 A | 11/2000 | Irons | | |
| 6,417,542 B2 * | 7/2002 | Werner | ......................... | 257/335 |
| 6,720,615 B2 * | 4/2004 | Fujihira | ........................ | 257/328 |
| 6,724,041 B2 * | 4/2004 | Rumennik et al. | ............. | 257/336 |
| 6,724,043 B1 * | 4/2004 | Ekkanath Madathil | ...... | 257/341 |
| 6,825,565 B2 * | 11/2004 | Onishi et al. | ................... | 257/773 |
| 7,002,205 B2 * | 2/2006 | Onishi et al. | ................... | 257/328 |
| 7,091,557 B2 * | 8/2006 | Deboy | ........................... | 257/339 |
| 7,772,668 B2 * | 8/2010 | Pan | ................................ | 257/492 |
| 7,777,249 B2 * | 8/2010 | Hamaguchi et al. | .......... | 257/133 |
| 2003/0006415 A1 | 1/2003 | Yokogawa et al. | | |
| 2007/0045700 A1 * | 3/2007 | Ohtani et al. | .................. | 257/301 |
| 2007/0114599 A1 * | 5/2007 | Hshieh | ........................... | 257/330 |
| 2007/0138546 A1 * | 6/2007 | Kawamura et al. | ............ | 257/330 |
| 2008/0290403 A1 * | 11/2008 | Ono et al. | ...................... | 257/329 |

\* cited by examiner

*Primary Examiner* — Wael Fahmy
*Assistant Examiner* — Sarah Salerno
(74) *Attorney, Agent, or Firm* — Bo-In Lin

(57) ABSTRACT

This invention discloses a semiconductor power device formed in a semiconductor substrate. The semiconductor power device further includes rows of multiple horizontal columns of thin layers of alternate conductivity types in a drift region of the semiconductor substrate where each of the thin layers having a thickness to enable a punch through the thin layers when the semiconductor power device is turned on. In a specific embodiment the thickness of the thin layers satisfying charge balance equation $q*N_D*W_N = q*N_A*W_P$ and a punch through condition of $W_P < 2*W_D*[N_D/(N_A+N_D)]$ where $N_D$ and $W_N$ represent the doping concentration and the thickness of the N type layers 160, while $N_A$ and $W_P$ represent the doping concentration and thickness of the P type layers; $W_D$ represents the depletion width; and q represents an electron charge, which cancel out. This device allows for a near ideal rectangular electric field profile at breakdown voltage with sawtooth like ridges. In another exemplary embodiment, the semiconductor power device further includes a sawtooth insulated gate bipolar transistor (IGBT). In another exemplary embodiment, the semiconductor power device further includes a metal oxide semiconductor field effect transistor (MOSFET). In another exemplary embodiment, the semiconductor power device further includes a power diode.

20 Claims, 7 Drawing Sheets

SAWTOOTH ELECTRIC FIELD DRIFT REGION STRUCTURE FOR POWER SEMICONDUCTOR DEVICES

BACKGROUND OF THE INVENTION

1. Field of the Invention

The invention relates generally to the semiconductor power devices. More particularly, this invention relates to new configurations and methods for manufacturing improved drift region that achieves a sawtooth shaped electric field profile that for implementation in power semiconductor devices such as insulated gate bipolar transistors (IGBT), power MOSFETs, emitter switched thyristors and power diodes.

2. Description of the Prior Art

Conventional technologies to configure and manufacture vertical power devices have difficulties and limitations to further improve the performances due to the tradeoff between the forward blocking voltage and the on-state voltage drop. The performance is further limited by another trade-off between the switching speed and the on-state forward voltage drop for devices that undergo "conductivity modulation" during forward conduction. A reduced doping concentration in the drift region generally formed in an epitaxial layer of the semiconductor power device is required for the device to block high voltages. However, the presence of the low-doped region leads to higher resistance and reduced forward conduction and reduced power efficiency and increased heat generation. Bipolar devices such as IGBTs and emitter switched thyristors improve the on-state voltage drop by high level of minority carrier injection in the low-doped drift region during conduction. However, the drawback in this case is the degradation in the switching performance.

One of the major scopes for improvement in vertical power devices comes from improving the electric field profile in the drift region. A typical vertical power device has a triangular or trapezoidal electric field during a forward blocking mode depending on whether it has a non-punch through or a punch through design, respectively. However, these electric field profiles require a thicker than necessary drift regions. An ideal electric field profile that requires the minimum thickness of the resistive drift region is a rectangular shape. This can be observed in FIG. 5, which is explained in greater detail later in the disclosure.

FIG. 1 (Prior Art) shows the cross section of a conventional insulated gate bipolar transistor (IGBT). The IGBT is a semiconductor power device that combines the metal oxide-semiconductor (MOS) gate control and bipolar current flow mechanism. The functional features of both a metal-oxide-semiconductor field effect transistor (MOSFET) and a bipolar junction transistor (BJT) are combined in an IGBT. Performance features of IGBT are designed to achieve a higher current density than the MOSFETs and faster switching characteristics than the BJTs. For these reasons, IGBT devices are implemented for high power (>10 kW), low to medium frequency (up to 30 kHz) applications. However, the conventional IGBT as shown in FIG. 1 is still confronted with the technical limitations that the drift region electric field does not have the ideal rectangular shape. So, it requires a drift region thickness that is more than the minimum necessary for sustaining the blocking voltage.

Accordingly, there is a need to provide new configuration for a semiconductor power device with improved electric field in the drift region. It is desirable that the semiconductor power device implemented with the new and improved drift region structures for providing improved drift region electric field can achieve the same voltage blocking capability as a conventional semiconductor power devices, such as a conventional IGBT, with a significant reduction, e.g., 20% reduction, in the thickness of the drift region. It is further desirable to provide the improved semiconductor power device with thinner drift region to achieve improved forward voltage drop, and switching performance to broaden the applications of the semiconductor power devices including but not limited to IGBT, power diodes, power thyristors and power MOSFETs.

SUMMARY OF THE PRESENT INVENTION

It is therefore an aspect of the present invention to provide a new and improved device configuration and manufacturing method for providing a drift region for a semiconductor power device such as an IGBT that can achieve high voltage blocking capabilities with a silicon bulk based conduction mode. The improved drift region is implemented with rows of multiple horizontal columns of thin layers of alternating P type and N type conductivity. The thin doped-layers have doping concentration and thickness selected to achieve charge balance between adjacent P type and N type layers. In addition, the thickness and doping of the P type layers are chosen such that they undergo punch through via the built-in potential from the N layers on their top and bottom. This is critical to ensure current flow during forward conduction operation of this device.

Specifically, it is an aspect of the present invention to provide a new and improved device configuration and manufacturing method for providing a semiconductor power device, such as an IGBT, that can achieve high voltage application implemented with rows of multiple horizontal columns of thin layers of alternating conductivity types that achieve a charge balance, thus enabling a sawtooth shaped electric field during forward blocking. This electric field achieves the optimum voltage blocking capability for the drift region, and requires about 20% lower drift region thickness as compared to a conventional IGBT.

Another aspect of the present invention is to provide drift layers in the drift region of a semiconductor power device with alternating P and N types of doping layers. The breakdown voltage of the semiconductor power device is independent of the doping concentrations of the P and N layers. Therefore, it is possible to increase the doping level by more than an order of magnitude, as long as the charge balance is maintained, and the P layers undergo punch through from the built in depletion widths of the adjacent junctions.

It is another aspect of the present invention to provide a new and improved device configuration and manufacturing method for providing an improved sawtooth IGBT that can achieve high voltage application implemented with rows of multiple horizontal columns of thin layers of alternating conductivity types to decrease the gate-drain capacitance because of the decoupling effects created by these horizontal columns of thin doping layers. The thickness and doping of these thin doping layers should be such that charge balance is maintained, and the P layers undergo punch through from the built in depletion widths of the adjacent junctions.

It is another aspect of the present invention to provide new and improved device configuration and manufacturing method to manufacture semiconductor power device with reduced resistance and improved switching speed by increasing the dopant concentration in a drift region without compromising the breakdown voltage. The new device configuration and manufacturing method are implemented with rows of multiple horizontal columns of thin layers of alternating conductivity types. The thickness of these thin doping layers should be such that charge balance is maintained, and the P layers undergo punch through from the built in depletion widths of the adjacent junctions.

Briefly in a preferred embodiment this invention discloses a semiconductor power device formed in a semiconductor substrate. The semiconductor power device further includes rows of multiple horizontal columns of thin layers of alternating P type and N type layers in the drift region of the semiconductor substrate where each of the thin layers has a doping and thickness to enable charge balance and the P-doped layers undergo a punch through from the built in depletion widths of the adjacent layers.

Furthermore, this invention discloses a method of manufacturing a semiconductor power device in a semiconductor substrate. The method includes a step of forming rows of multiple horizontal columns of thin layers of alternating conductivity types in a drift region of the semiconductor substrate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

This invention discloses a technique to achieve a drift region with electric field that approximates the ideal rectangular shape. In order to illustrate the concept, a vertical planar Insulated Gate Bipolar Transistor will be used. However, as stated earlier, the concept can be applied to all vertical/lateral semiconductor power devices.

Figure 2:
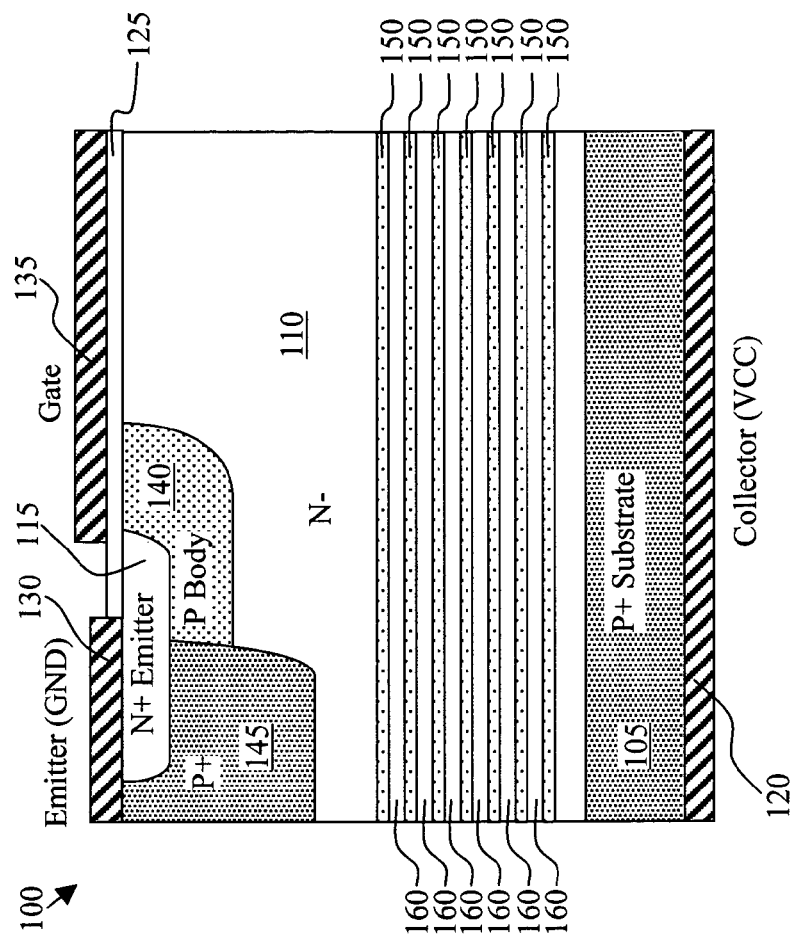
FIG. 2 is a cross sectional view of a sawtooth IGBT of this invention, with alternating P and N type layers in the drift region.
Figure 1:
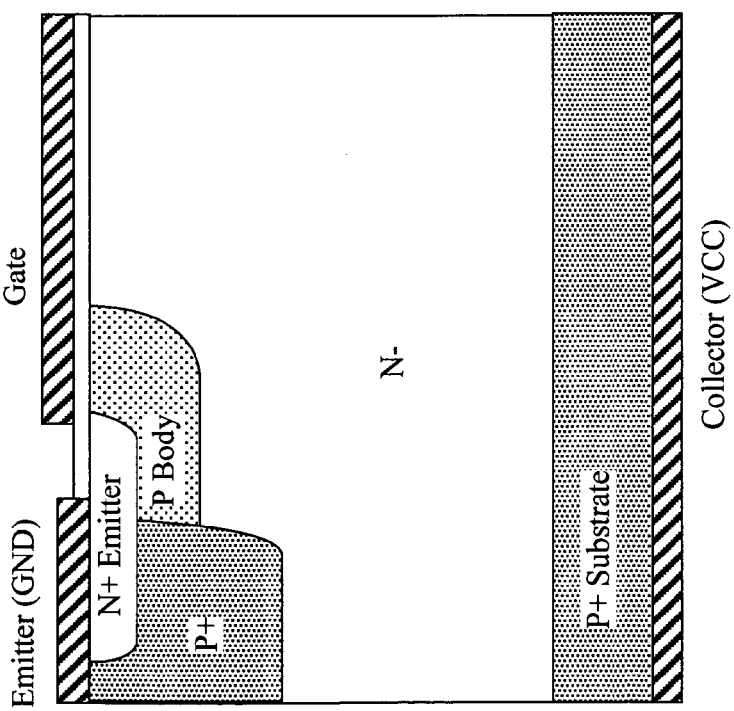
FIG. 1 is the cross sectional view for showing a conventional IGBT.

Referring to FIG. 2 for a cross-sectional view of the sawtooth IGBT 100, the IGBT may be implemented as a component of an integrated circuit not specifically shown. The IGBT 100 is formed in a semiconductor substrate 105 that has a first conductivity type, e.g., a P type substrate 105. An epitaxial layer 110 of a second conductivity type, an N− epitaxial layer 110, is supported on top of the P-type substrate 105. The IGBT 100 is a vertical IGBT device with a collector electrode 120 disposed on a bottom surface of the substrate and an emitter electrode 130 disposed on a top surface. A gate 135 is supported on top of an insulation layer 125. An emitter region 115 is formed underneath the emitter electrode 130 encompassed in a P-body region 140 extended below the emitter N-region 115 from a P+ region 145 to a region underneath the gate insulation layer 125. When a gate voltage exceeding a threshold voltage is applied, the NPN bipolar transistor is turned on. An electrical current is conducted from the emitter region 115 through the P-body region 140 and the P+ region 145 to the drift region as part of the N-epitaxial layer 110 to the substrate 105 and then to the collector 120.

Figure 3B:
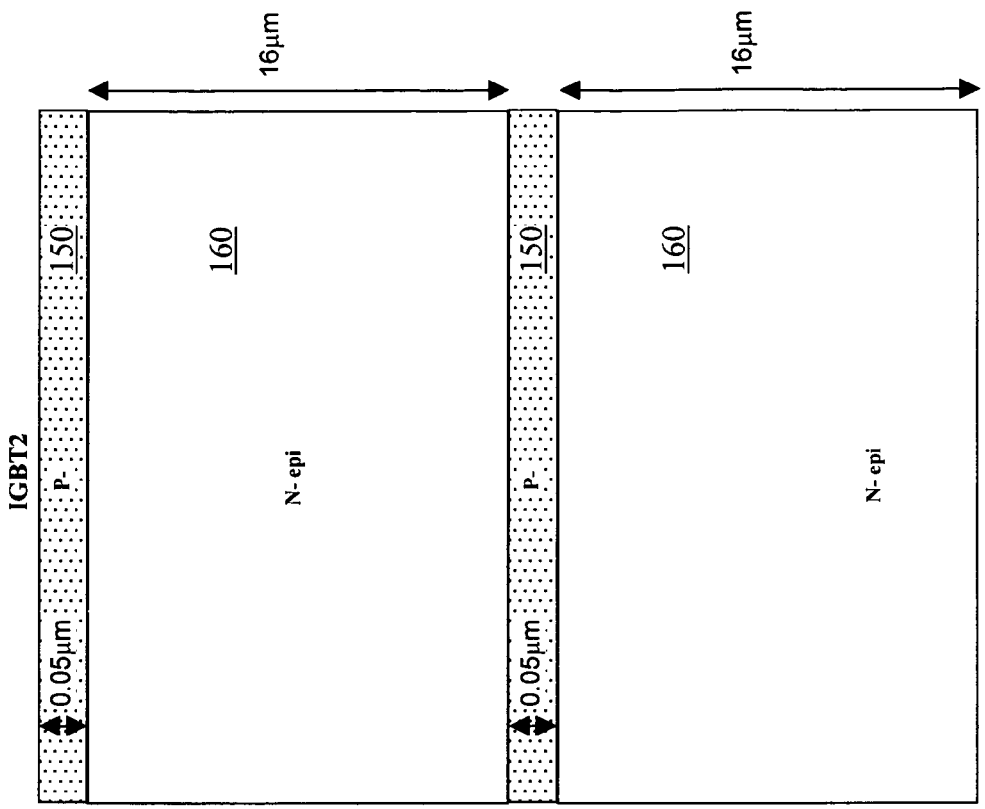
FIGS. 3A and 3B are the cross sectional views of the horizontal P layers with adjacent N layers on top and bottom for two different designs of the drift layers of this invention.
Figure 3A:
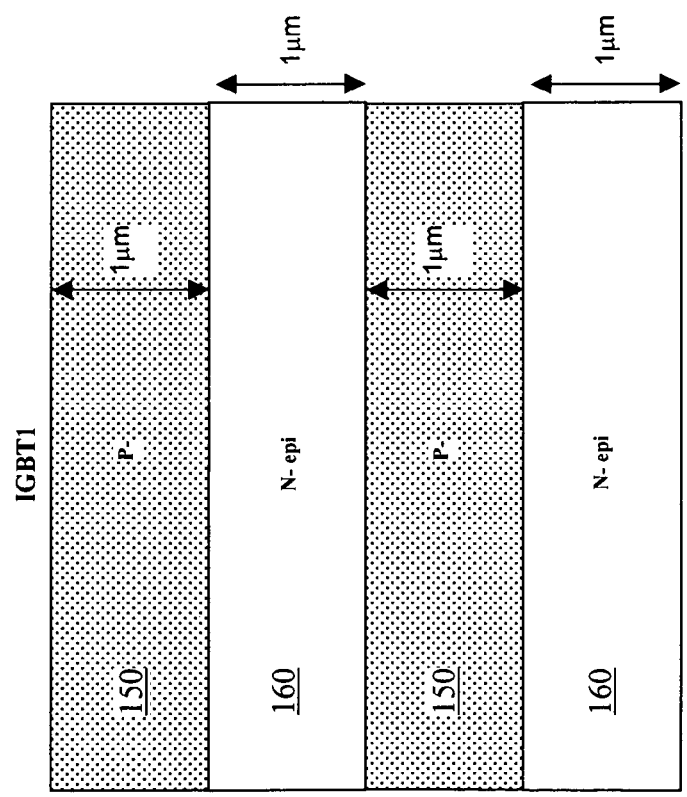

The vertical IGBT device 100 further includes a plurality rows of P-doped horizontal columns 150 formed in the drift epitaxial layer 110 thus forming rows of alternating N-type horizontal columns 160 and P-type horizontal columns 150. Referring to FIGS. 3A and 3B for a more detailed illustration of the doped N-type horizontal column 150 and P-type horizontal columns 160. FIG. 3A shows the dimensions of columns 150 and 160 for one possible configuration, designated IGBT1. For IGBT1, the P-type horizontal columns 150 have a width of 1 μm, and the N-type horizontal columns 160 have a width of 1 μm. FIG. 3B shows the dimensions of columns 150 and 160 for an alternate configuration, designated IGBT2. For IGBT2, the P-type horizontal columns 150 have a width of 0.05 μm, and the N-type horizontal columns 160 have a width of 16 μm. The width of the horizontal columns 150 and 160 can be calculated according to the following equations. The charge balance condition can be represented as:

$$\text{Charge Balance: } q^*N_D^*W_N = Q^*N_A^*W_P$$

where $N_D$ and $W_N$ represent the doping concentration and the thickness of the N type layers 160, while $N_A$ and $W_P$ represent the doping concentration and thickness of the P type layers 150; q represents the charge of an electron, and cancels out.

Furthermore, in order to assure a punch through of the P horizontal columns 150, the thickness of the P horizontal columns 150 is formed within a limit according to the following equation:

$$W_P < 2^* W_D^* [N_D/(N_A + N_D)]$$

where $W_D$ is the depletion width of the junctions of the alternating P and N type horizontal columns 150 and 160.

In accordance with the above two equations, the configurations for IGBT1 and IGBT2, as shown in FIGS. 3A and 3B were calculated. It should be clear to those skilled in the art that the configurations IGBT1 and IGBT2 are just two out of countless possible configurations for this invention, in accordance with the above equations.

The alternating P-type and N-type horizontal columns 150 and 160 can be formed during in situ doping of the epitaxial layer 110. In situ doping dopes the epitaxial layer as it is being grown, thus the doping process can be switched between N-type and P-type doping as epitaxial layer 110 is being grown to form the alternating P-type and N-type columns 150 and 160.

An alternative process of forming the horizontal columns 150 and 160 is to grow an N-type epitaxial first (to form a single N-type column 160), then perform a shallow P-type implant to form column 150. This is repeated as many times as needed to form the alternating P-type and N-type horizontal columns 150 and 160. The latter process is appropriate for situations in which there are not many horizontal columns 150 and 160 and the P-type columns 150 are thin, such as in configuration IGBT2.

A major advantage of this invention is that no masks are required to make the P-type and N-type horizontal columns 150 and 160.

The alternating P-type horizontal columns 150 and N-type horizontal columns 160 in the epitaxial layer 110 generate a horizontal electric field in the epitaxial layer 110 functioning as a drift region for the semiconductor power device with sawtooth profile. The sawtooth electric field enables an optimum utilization of the drift region, and requires smaller epitaxial layer thickness for the same forward blocking voltage.

Figure 4:
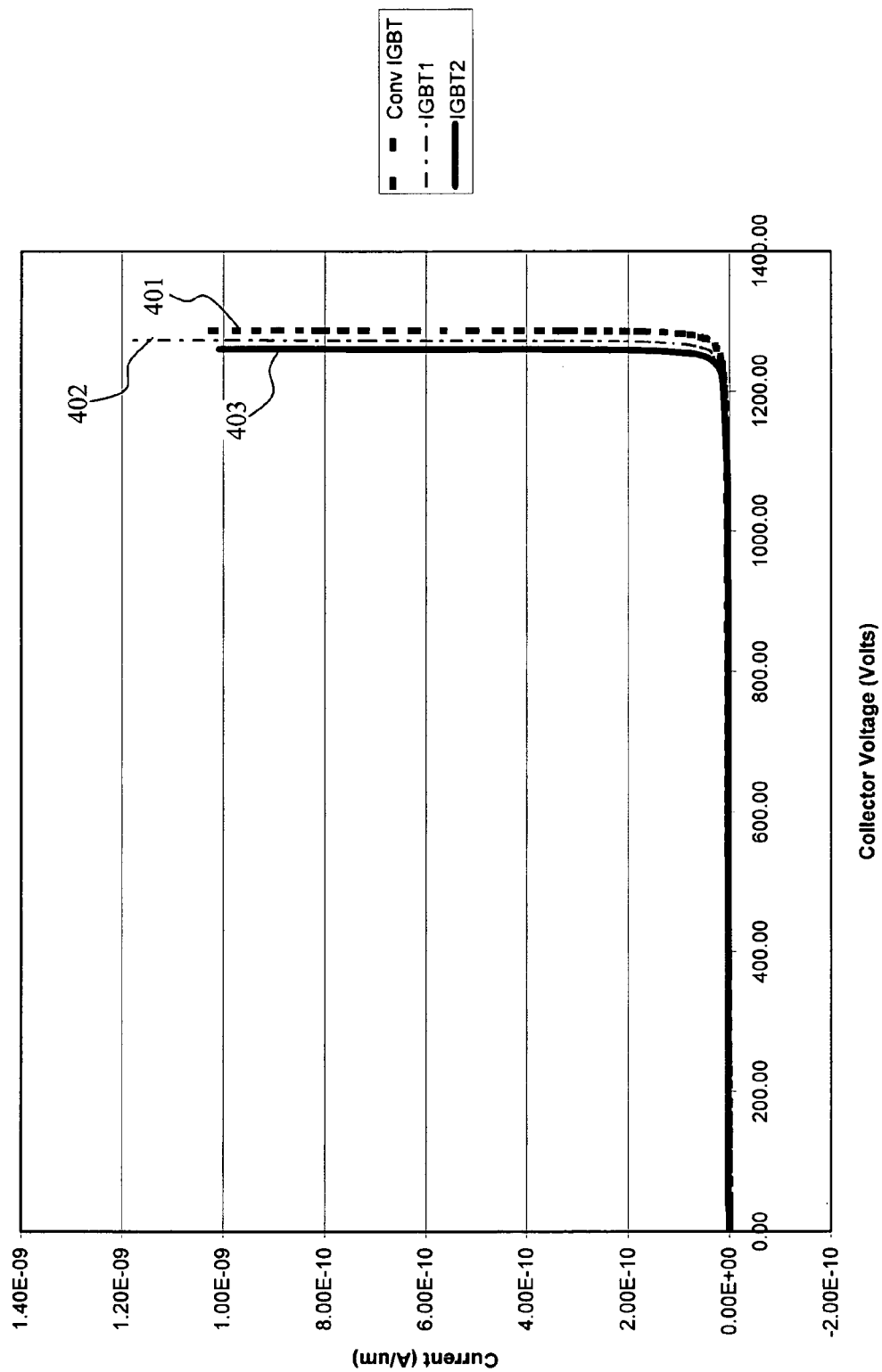
FIG. 4 is an I-V diagram for illustrating a comparison of the forward voltage blocking performances of a 1200 V IGBT of a conventional design with an N− drift region, and two different sawtooth IGBT devices of this invention.

FIG. 4 illustrates a comparison of the forward blocking I-V curves of a conventional 1200V IGBT device with two different configurations of sawtooth IGBT devices, IGBT1 and IGBT2. The I-V curves of the conventional IGBT and the sawtooth IGBTs, IGBT1 and IGBT2, are labeled 401, 402 and 403, respectively. As can be seen in the figure, all the devices have comparable breakdown voltages, all in excess of 1200 volts. However, the sawtooth IGBT devices of this invention have an epitaxial layer that is 20% less thick than that of the conventional IGBT device.

Figure 5:
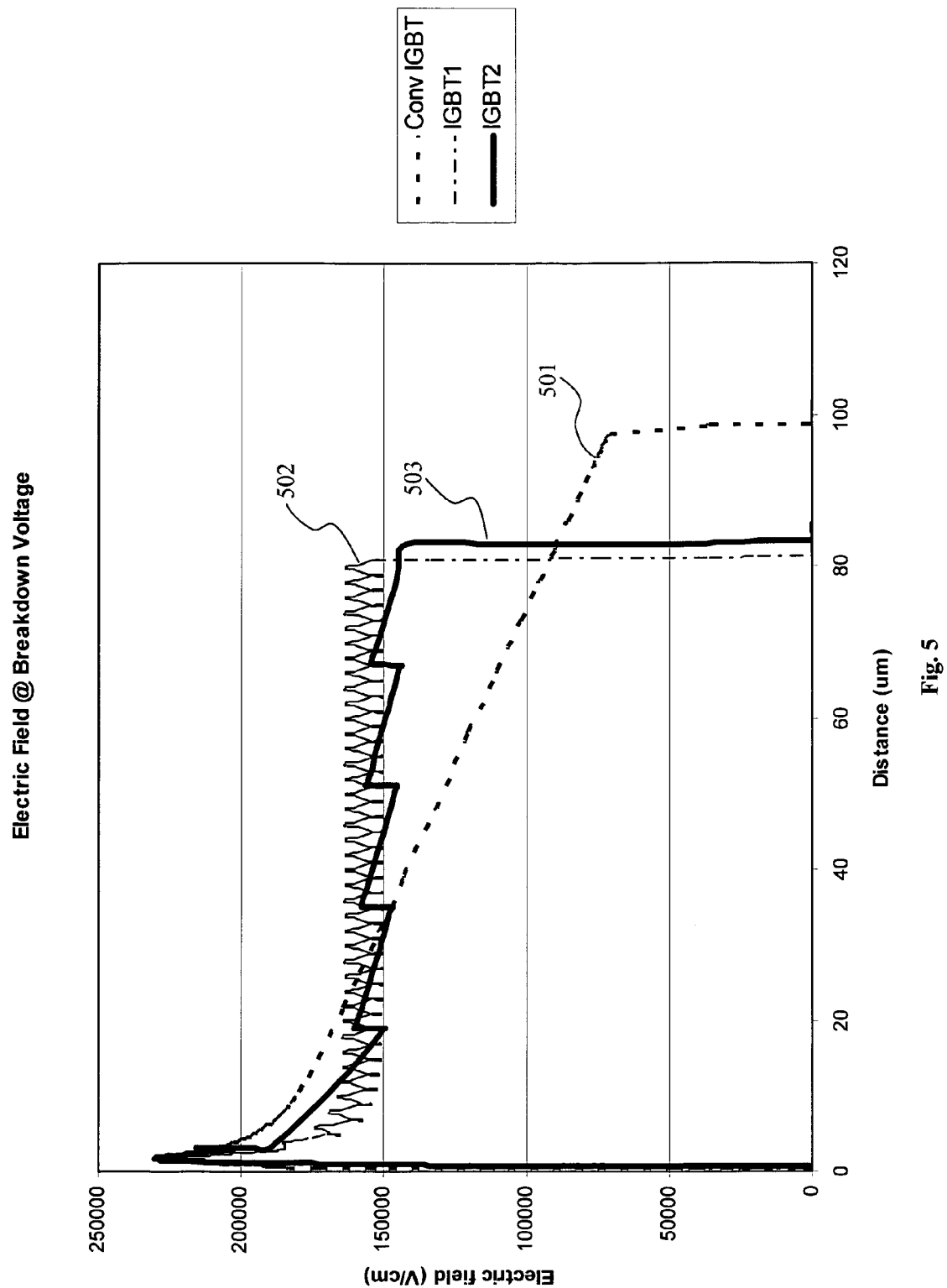
FIG. 5 is a diagram for illustrating a comparison of the vertical electric field along the drift region for the conventional IGBT and the two different sawtooh IGBT devices at breakdown voltage.

FIG. 5 compares the electric field profile at forward blocking breakdown voltage of the conventional IGBT device with two configurations of the sawtooth IGBT devices, IGBT1 and IGBT2. The horizontal axis, Distance (μm) is measured from the top of the epitaxial layer to bottom. The electric field curves of the conventional IGBT, and the sawtooth IGBTs, IGBT1 and IGBT2, are labeled 501, 502 and 503, respectively. The electric field profile of the conventional IGBT 501 is trapezoidal. The field peak at the beginning occurs at the P-body 140 and N-epi 110 junction due to the curvature of the P-body 140. The electric field drops along the drift region with a slope proportional to the doping of the drift region. At the junction of the N-epi 110 and the P+ substrate 105, the electric field goes to zero. Since the voltage supported in the epitaxial layer is the area under this curve, it can be concluded that as the electric field decreases along the drift region, the voltage supported across it will also be decreased, resulting in sub-optimal usage of this layer for a conventional semiconductor power device, e.g., a conventional IGBT. As can be further observed in FIG. 5, the electrical field of the conventional IGBT has a trapezoidal field profile that leads to sub-optimal utilization of the epitaxial layer, and thus requires a thicker drift region for the same blocking voltage. The sawtooth IGBT electric field profile (502 and 503) on the other hand is flat, with the sawtooth-like shape resulting from alternating P type and N type columns 150 and 160. A flat electric field results in optimum utilization of the epitaxial layer. The voltage supported across the epitaxial layer of the sawtooth IGBTs, as represented by the area under the sawtooth curves 502 and 503, is the same as the voltage supported by the conventional IGBT, as represented by the area under the curve 501, even though the epitaxial thickness of the sawtooth IGBTs is 20% smaller. Therefore, the limitation is overcome in the sawtooth IGBT of this invention. As can be seen from the electric field profile for the two IGBT devices shown in FIG. 5. The presence of alternating, charge balanced P and N layers causes the electrical field to remain horizontal, with small spikes that make it resemble a sawtooth, This electric field profile ensures that the voltage supported along the drift region remains constant throughout, resulting optimal utilization.

Figure 6:
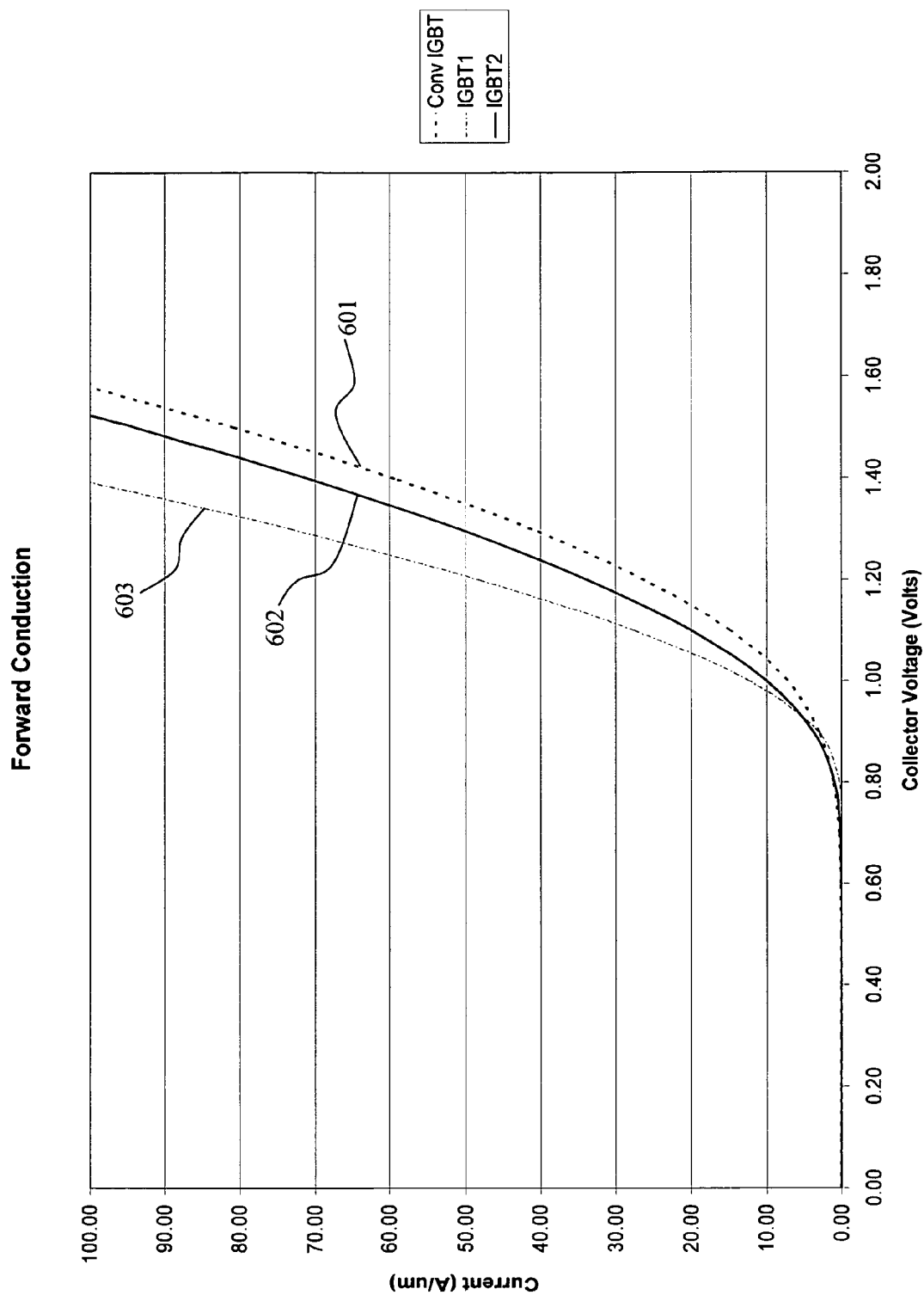
FIG. 6 is an I-V diagram for illustrating a comparison of the forward conducting performances of the conventional IGBT with the two different sawtooth IGBT devices of this invention.

The presence of a thinner epitaxial region causes a lower forward voltage drop during the conduction state of this device, as shown in FIG. 6. FIG. 6 is an I-V diagram for illustrating a comparison of the forward conducting performances of the conventional IGBT with two possible configurations of sawtooth IGBT devices of this invention, IGBT1 and IGBT2. The I-V curves of the conventional IGBT, and sawtooth IGBTs, IGBT1 and IGBT2, are labeled 601, 602 and 603, respectively. As can be seen in the figure, the sawtooth IGBTs have a reduced forward voltage drop as compared to the conventional IGBT, due to the presence of a thinner drift region. Another factor that leads to lower forward voltage drop for the sawtooth IGBT is that the doping of the N type and P type layers in the epitaxial layers are independent of the breakdown voltage. Therefore, it is possible to achieve an order of magnitude higher doping for these layers, as compared to a conventional IGBT N− epitaxial layer.

Figure 7B:
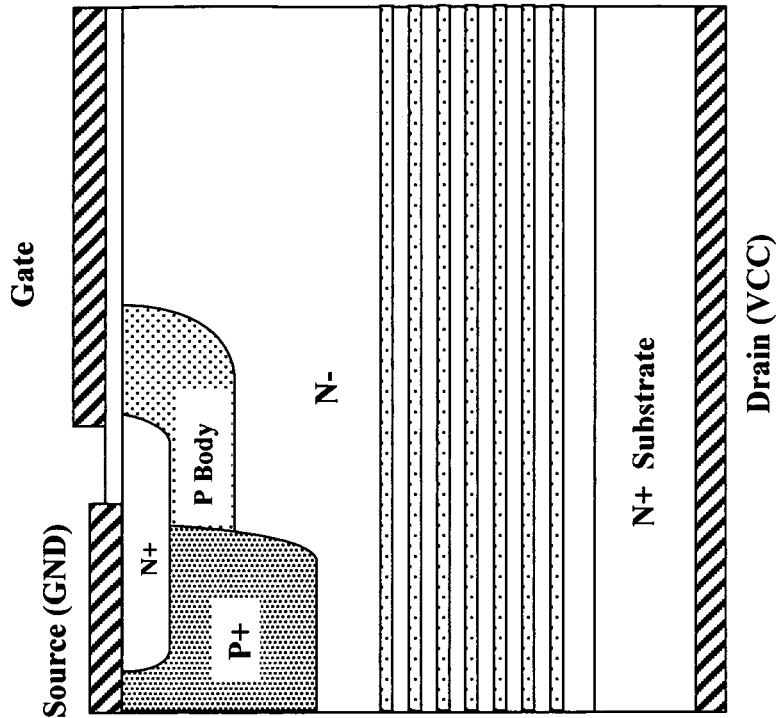
FIGS. 7A and 7B show the cross section of a conventional power MOSFET, and the sawtooth power MOSFET respectively.
Figure 7A:
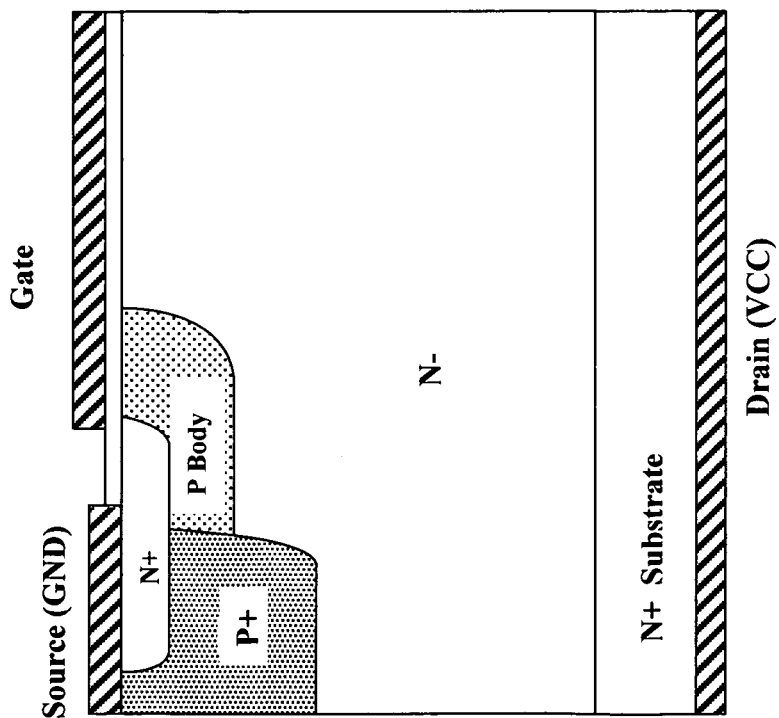
Figure 8B:
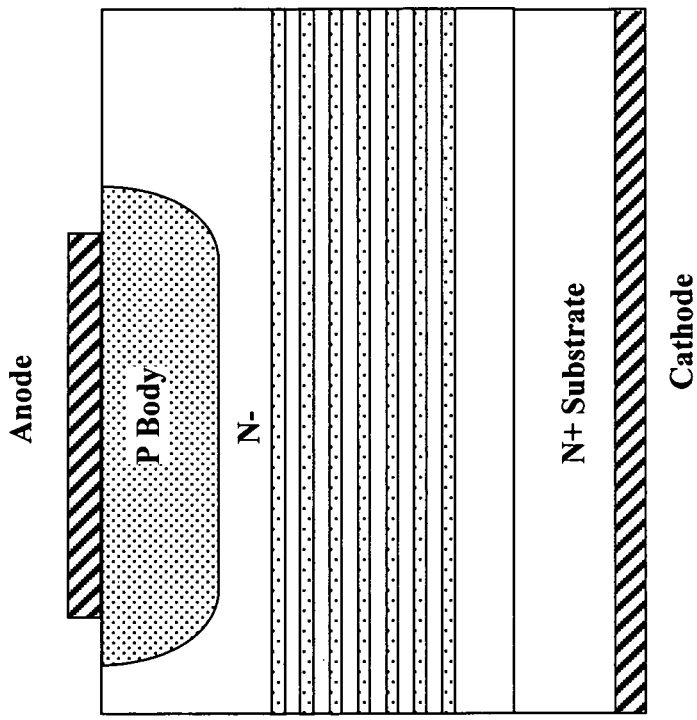
FIGS. 8A and 8B show the cross section of a conventional power diode and the sawtooth power diode respectively.
Figure 8A:
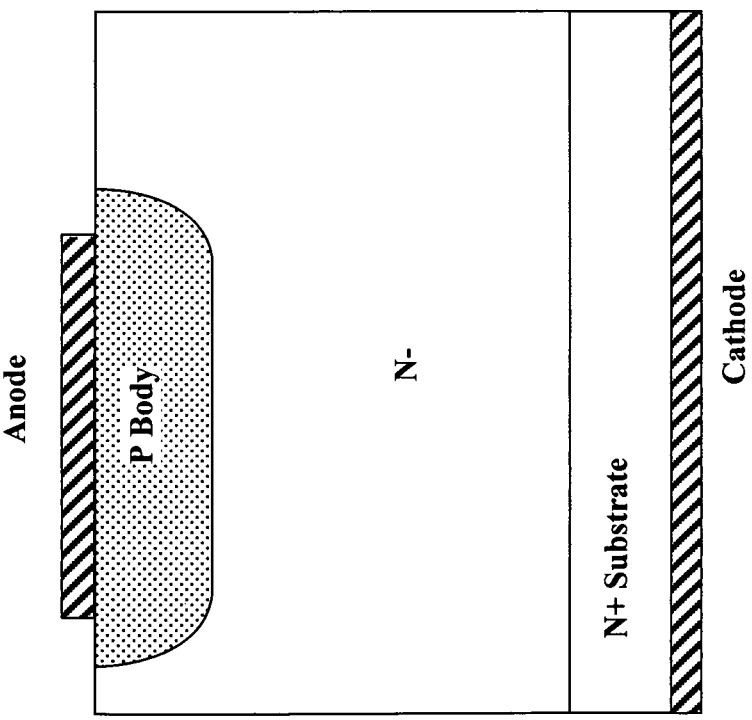

The concept of replacing the N− epitaxial layer with alternating P type and N type layers can be applied to other power semiconductor devices as well. FIGS. 7A (prior art) and 7B show the cross section of a conventional power MOSFET, and the sawtooth power MOSFET respectively. FIGS. 8A (prior art) and 8B show the cross section of a conventional power diode and the sawtooth power diode respectively.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, though an N-channel MOSFET device was shown, the invention could easily have been applied to a P-channel MOSFET could also be used, by reversing the polarities of the regions and layers (in this case, the N-type horizontal columns would need to undergo punch through rather than the P-type ones and the punch through equation would be similarly reversed: $W_N < 2*W_D*[N_A/(N_A+N_D)]$). Accordingly, it is intended that the appended claims be interpreted as covering all alterations and modifications as fall within the true spirit and scope of the invention.

I claim:

1. A vertical semiconductor power device formed in a semiconductor substrate comprising:

a first electrode disposed on a top surface and a plurality of dopant regions near the top surface in an epitaxial layer wherein a bottom portion of the epitaxial layer below the dopant regions constituting a uniformly doped region extending continuously and horizontally over an entire length of the semiconductor substrate functioning as a top layer of a drift region and a second electrode disposed on a bottom surface of the semiconductor surface; and rows of multiple horizontal slices of continuous thin layers of alternating P-type and N-type doped layers disposed immediately below the uniformly doped region of the epitaxial layer extending continuously and horizontally over substantially an entire horizontal length of the semiconductor substrate across the drift region of the semiconductor substrate where each of the continuous thin layers having a doping and a layer thickness to enable a charge balance and a punch through in said alternating doped layers during a conduction mode in conducting a current in a vertical direction between the first electrode and the second electrode perpendicular to and cross over said horizontal slices of said P-doped and N-doped layers.

2. The semiconductor device of claim 1 wherein:

said drift region in said semiconductor substrate for conducting said current through said vertical direction therethrough comprising said horizontal slices of doped layers extending over substantially the entire horizontal length of the semiconductor substrate having a set of said N-type doped layers each disposed next to the said P-type doped layer having a layer thickness of $W_P$, wherein $W_P<2*W_D*[N_D/(N_A+N_D)]$ and $W_D$ represents a depletion width, $N_D$ represents a doping concentration of the N-type doped layers, and $N_A$ represents a doping concentration of said P-type doped layers.

3. The semiconductor device of claim 2 wherein:
said drift region in said semiconductor substrate for conducting said current in said vertical direction with said charge balance by having the dopant concentrations and the layer thicknesses satisfying an equation $q*N_D*W_N=q*N_A*W_P$ and q represents an electron charge and $W_N$ represents the layer thicknesses of said continuous N-type doped layers and $W_P$ represents the layer thicknesses of said continuous P-type doped layers.

4. The semiconductor device of claim 1 wherein:
said drift region in said semiconductor substrate having said continuous thin layers of alternating P-type and N-type doped layers extending over substantially the entire horizontal length of the semiconductor substrate conducting said current in said vertical direction while undergoing a punch through from a built in depletion widths of adjacent layers of an alternating conductivity type.

5. The semiconductor device of claim 1 wherein:
said epitaxial layer with said uniformly doped region comprises a uniformly P-doped region disposed immediately above said drift region having said continuous thin layers of the N-conductivity type disposed next to said continuous thin layers of the P-conductivity type conducting said current in said vertical direction while undergoing a punch through in said thin layers of the P-conductivity type from a built in depletion widths of adjacent layers of said N-conductivity type.

6. The semiconductor device of claim 1 wherein:
said epitaxial layer with said uniformly doped region comprises a uniformly N-doped region disposed immediately above said drift region having said continuous thin layers of the P-conductivity type disposed next to said continuous thin layers of the N-conductivity type conducting said current in said vertical direction while undergoing a punch through in said thin layers of the N-conductivity type from a built in depletion widths of adjacent layers of said P-conductivity type.

7. The semiconductor device of claim 1 wherein:
said semiconductor power device further comprising an insulated gate bipolar transistor (IGBT).

8. The semiconductor device of claim 1 wherein:
said semiconductor power device further comprising an insulated gate bipolar transistors (IGBT) supported on a P-type substrate formed with a collector disposed on a bottom surface of said P-type substrate having a N-type drift region supported on said P-type substrate with an emitter disposed on a top surface.

9. The semiconductor device of claim 1 wherein:
said semiconductor power device further comprising a metal oxide semiconductor field effect transistor (MOSFET).

10. The semiconductor device of claim 8 wherein:
said semiconductor power device further comprising an N-channel MOSFET.

11. The semiconductor device of claim 8 wherein:
said semiconductor power device further comprising a P-channel MOSFET.

12. The semiconductor device of claim 1 wherein:
said semiconductor power device further comprising an emitter switching thyristor.

13. The semiconductor device of claim 1 wherein:
said semiconductor power device further comprising a power diode.

14. The semiconductor device of claim 1 wherein:
said semiconductor power device further comprising a power diode supported on a N+ substrate with a N− drift regions supported thereon having a cathode disposed on a bottom surface of said substrate and an anode dispose on a top surface.

15. A vertical semiconductor power device formed in a semiconductor substrate comprising:
a first electrode disposed on a top surface and a plurality of dopant regions near the top surface in an epitaxial layer wherein a bottom portion of the epitaxial layer below the dopant regions constituting a uniformly doped region extending continuously and horizontally over an entire length of the semiconductor substrate functioning as a top layer of a drift region and a second electrode disposed on a bottom surface of the semiconductor surface; and
rows of multiple horizontal slices of continuous thin layers of alternating P-type and N-type doped layers disposed immediately below the uniformly doped region of the epitaxial layer extending continuously and horizontally under an insulated gate over substantially an entire horizontal length of the semiconductor substrate across the drift region of the semiconductor substrate where each of the continuous thin layers having a doping and a layer thickness to enable a charge balance and a punch through in said alternating doped layers during a conduction mode in conducting a current in a vertical direction between the first electrode and the second electrode perpendicular to and cross over said horizontal slices of said P-doped and N-doped layers.

16. The semiconductor device of claim 15 wherein:
said drift region in said semiconductor substrate for conducting said current through said vertical direction therethrough comprising said horizontal slices of doped layers below the insulated gate having a set of said N-type doped layers each disposed next to the said P-type doped layer having a layer thickness of $W_P$, wherein $W_P<2*W_D*[N_D/(N_A+N_D)]$ and $W_D$ represents a depletion width, $N_D$ represents a doping concentration of the N-type doped layers, and $N_A$ represents a doping concentration of said P-type doped layers.

17. The semiconductor device of claim 16 wherein:
said drift region in said semiconductor substrate for conducting said current in said vertical direction with said charge balance by having the dopant concentrations and the layer thicknesses satisfying an equation $q*N_D*W_N=q*N_A*W_P$ and q represents an electron charge and $W_N$ represents the layer thicknesses of said continuous N-type doped layers and $W_P$ represents the layer thicknesses of said continuous P-type doped layers.

18. The semiconductor device of claim 15 wherein:
said drift region in said semiconductor substrate having said continuous thin layers of alternating P-type and N-type doped layers below the insulated gate conducting said current in said vertical direction while undergoing a punch through from a built in depletion widths of adjacent layers of an alternating conductivity type.

19. The semiconductor device of claim 15 wherein:
said semiconductor power device further comprising an insulated gate bipolar transistor (IGBT).

20. The semiconductor device of claim 15 wherein:
said semiconductor power device further comprising a metal oxide semiconductor field effect transistor (MOSFET).

* * * * *